(12) United States Patent
Osamura et al.

(10) Patent No.: US 12,117,492 B2
(45) Date of Patent: Oct. 15, 2024

(54) SYSTEM IDENTIFICATION METHOD AND SYSTEM IDENTIFICATION DEVICE

(71) Applicant: Marelli Corporation, Saitama (JP)

(72) Inventors: Kensuke Osamura, Saitama (JP); Junpei Katashiba, Saitama (JP); Shuichi Adachi, Yokohama (JP); Risako Sasaki, Yokohama (JP); Ichiro Maruta, Kyoto (JP); Takahiro Kawaguchi, Tokyo (JP)

(73) Assignee: Marelli Corporation, Saitama (JP)

( * ) Notice: Subject to any disclaimer, the term of this patent is extended or adjusted under 35 U.S.C. 154(b) by 644 days.

(21) Appl. No.: 17/421,760

(22) PCT Filed: Jan. 10, 2020

(86) PCT No.: PCT/JP2020/000745
§ 371 (c)(1),
(2) Date: Jul. 9, 2021

(87) PCT Pub. No.: WO2020/145402
PCT Pub. Date: Jul. 16, 2020

(65) Prior Publication Data
US 2022/0091189 A1    Mar. 24, 2022

(30) Foreign Application Priority Data

Jan. 11, 2019 (JP) ................. 2019-003754
Dec. 26, 2019 (JP) ................. 2019-236515

(51) Int. Cl.
*G01R 31/367* (2019.01)
*B60W 20/13* (2016.01)
(Continued)

(52) U.S. Cl.
CPC ........ *G01R 31/367* (2019.01); *F02N 11/0818* (2013.01); *F02N 11/0862* (2013.01);
(Continued)

(58) Field of Classification Search
CPC ............... G01R 31/367; G01R 31/369; G01R 31/3835; F02N 11/0818; F02N 11/0862;
(Continued)

(56) References Cited

U.S. PATENT DOCUMENTS

2017/0176540 A1    6/2017 Omi et al.

FOREIGN PATENT DOCUMENTS

JP      2003293344 A  * 10/2003
JP      2010230469 A  * 10/2010
(Continued)

OTHER PUBLICATIONS

S. M. Mahdi "Identifiability of generalised Randles circuit models", pp. 1-8, May 26, 2016 (Year: 2016).*
(Continued)

*Primary Examiner* — Michael J Dalbo
*Assistant Examiner* — Kaleria Knox
(74) *Attorney, Agent, or Firm* — Young Basile Hanlon & MacFarlane, P.C.

(57) ABSTRACT

A system identification method executed by a system identification device that estimates a response of a system having a current flowing in a battery as input and an overvoltage of the battery as output, comprises: a first step of identifying the system by applying a model of the battery including a FIR model and an ARX model to the system, based on time series data of each of the current flowing in the battery and the overvoltage of the battery in a predetermined period; and a second step of estimating, based on the model of the battery, the overvoltage of the battery output from the system at an estimation target time after an input start time in the case where no current is input before the input start time and the current is input to the system from the input start time onwards.

16 Claims, 9 Drawing Sheets

(51) Int. Cl.
| | |
|---|---|
| *B60W 30/192* | (2012.01) |
| *F02N 11/08* | (2006.01) |
| *G01R 31/3835* | (2019.01) |
| *G01R 31/389* | (2019.01) |
| *H01M 10/0525* | (2010.01) |
| *H01M 10/48* | (2006.01) |
| *H02J 7/00* | (2006.01) |

(52) U.S. Cl.
CPC ....... *G01R 31/3835* (2019.01); *G01R 31/389* (2019.01); *H01M 10/0525* (2013.01); *H01M 10/48* (2013.01); *B60W 20/13* (2016.01); *B60W 30/192* (2013.01); *B60W 2510/244* (2013.01); *F02N 2200/062* (2013.01); *H01M 2220/20* (2013.01); *H02J 7/0047* (2013.01)

(58) Field of Classification Search
CPC .. H01M 10/48; H01M 2220/20; B60W 20/13; B60W 30/192; B60W 2510/244; B02N 2200/062; H02J 7/0047
See application file for complete search history.

(56) References Cited

FOREIGN PATENT DOCUMENTS

| JP | 2016211405 A | * 12/2016 | |
|---|---|---|---|
| JP | 2017198542 A | 11/2017 | |
| WO | WO-2015133103 A1 | * 9/2015 | ........... G01R 31/367 |

OTHER PUBLICATIONS

International Preliminary Report on Patentability of corresponding application PCT/JP2020/000745; dated Jun. 16, 2021; 11 pages.

* cited by examiner

SYSTEM IDENTIFICATION METHOD AND SYSTEM IDENTIFICATION DEVICE

CROSS REFERENCE TO RELATED APPLICATION

This application claims priority to and the benefit of Japanese Patent Application No. 2019-3754 filed on Jan. 11, 2019 and Japanese Patent Application No. 2019-236515 filed on Dec. 26, 2019, the entire disclosures of which are incorporated herein by reference.

TECHNICAL FIELD

The present disclosure relates to a system identification method and a system identification device.

BACKGROUND

Devices for identifying parameters of a system representing a model of a battery are known (for example, see PTL 1).

CITATION LIST

Patent Literature

PTL 1: JP 2017-198542 A

SUMMARY

Technical Problem

In the case where a battery is installed in an automobile, the battery discharges to supply a current required for the operation of the automobile. When the discharge current increases, the terminal voltage of the battery decreases due to an increase in the overvoltage of the battery. In the case where the terminal voltage of the battery decreases, the battery may become unable to supply the current required by the automobile. To determine whether the battery can supply the current required by the automobile, the overvoltage of the battery at discharge start needs to be estimated with high accuracy.

It could therefore be helpful to provide a system identification method and a system identification device that can estimate the overvoltage of a battery at discharge start with high accuracy.

Solution to Problem

A system identification method according to a first aspect is executed by a system identification device configured to estimate a response of a system that has a current flowing in a battery as input and an overvoltage of the battery as output. The system identification method comprises: a first step of identifying the system by applying a model of the battery including a FIR model and an ARX model to the system, based on time series data of each of the current flowing in the battery and the overvoltage of the battery in a predetermined period; and a second step of estimating, based on the model of the battery applied to identify the system in the first step, the overvoltage of the battery output from the system at an estimation target time in the case where no current is input to the system before an input start time and the current is input to the system from the input start time onwards, the estimation target time being after the input start time. The number of sets of data applied to the FIR model in the time series data is greater than or equal to a number obtained by adding 1 to a number obtained by dividing a period from the input start time to the estimation target time by a sampling cycle.

A system identification device according to a second aspect comprises a response estimation unit configured to estimate a response of a system that has a current flowing in a battery as input and an overvoltage of the battery as output. The response estimation unit is configured to: identify the system by applying a model of the battery including a FIR model and an ARX model to the system, based on time series data of each of the current flowing in the battery and the overvoltage of the battery in a predetermined period; and estimate, based on the model of the battery applied to identify the system, the overvoltage of the battery output from the system at an estimation target time in the case where no current is input to the system before an input start time and the current is input to the system from the input start time onwards, the estimation target time being after the input start time. The number of sets of data applied to the FIR model in the time series data is greater than or equal to a number obtained by adding 1 to a number obtained by dividing a period from the input start time to the estimation target time by a sampling cycle.

Advantageous Effect

The system identification method according to the first aspect can estimate the overvoltage of a battery at discharge start with high accuracy.

The system identification device according to the second aspect can estimate the overvoltage of a battery at discharge start with high accuracy.

DETAILED DESCRIPTION

Figure 1:
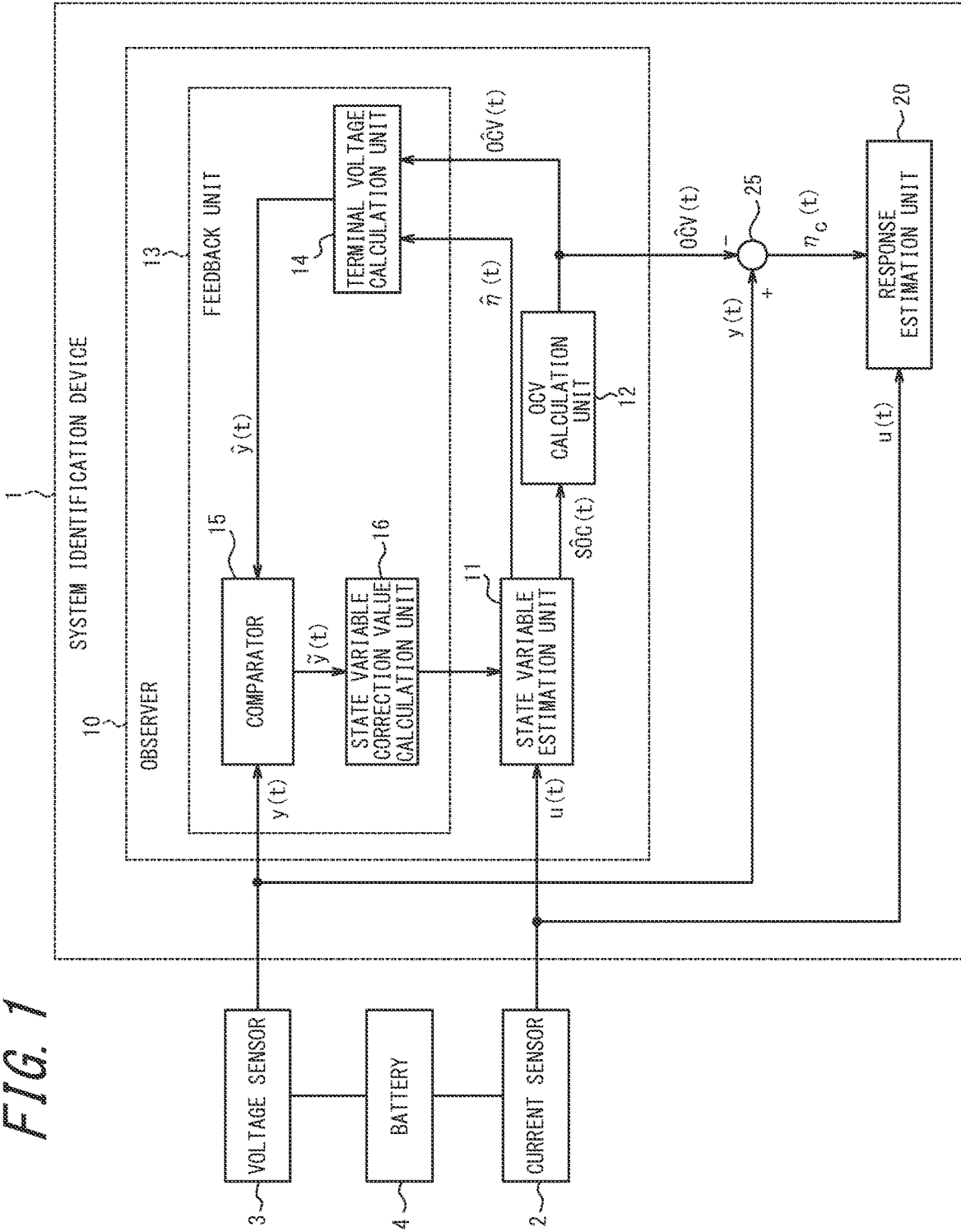
FIG. 1 is a block diagram illustrating an example of the structure of a system identification device according to one of the disclosed embodiments.

A system identification device 1 according to one of the disclosed embodiments includes an observer 10, a response estimation unit 20, and an operation unit 25, as illustrated in FIG. 1.

The system identification device 1 may be composed of, for example, a processor or a microcomputer. The functions of each component included in the system identification device 1 may be implemented by a processor or the like executing a program, or by a dedicated processor specialized in specific processes. The system identification device 1 may include a storage unit. The storage unit may be composed of, for example, semiconductor memory or a magnetic storage device. The system identification device 1 may store data, information, and the like handled in its processes, in the storage unit.

The system identification device 1 is connected to a battery 4 via a current sensor 2 and a voltage sensor 3. The system identification device 1 may include the current sensor 2 and/or the voltage sensor 3.

The battery 4 may be, for example, a secondary battery. The secondary battery is also called a rechargeable battery. In this embodiment, it is assumed that the battery 4 is a lithium ion battery. The battery 4 may be any other type of battery.

The current sensor 2 measures the charge/discharge current flowing in the battery 4. In this embodiment, time is denoted by t. The charge/discharge current is denoted by $u(t)$ as a function of time. The current sensor 2 outputs the measured value of the charge/discharge current to the system identification device 1.

The voltage sensor 3 measures the terminal voltage of the battery 4. In this embodiment, the terminal voltage is denoted by $y(t)$ as a function of time. The voltage sensor 3 outputs the measured value of the terminal voltage to the system identification device 1.

The terminal voltage of the battery 4 is expressed as the sum of the open circuit voltage (OCV) of the battery 4 and the overvoltage inside the battery 4. The OCV is the potential difference between the electrodes of the battery 4 in an electrochemical equilibrium state. The OCV corresponds to the terminal voltage of the battery 4 in the case where no charge/discharge current flows in the battery 4. The overvoltage corresponds to the magnitude of a voltage drop caused by internal impedance. The internal impedance is determined depending on the reaction rate of the electrochemical reaction inside the battery 4.

The terminal voltage of the battery 4 changes as a result of the charge/discharge current flowing in the battery 4. In the case where the battery 4 is represented by a system, the charge/discharge current flowing in the battery 4 corresponds to the input of the system, and the terminal voltage of the battery 4 corresponds to the output of the system. The system identification device 1 identifies the parameters of the system representing the battery 4.

Figure 2:
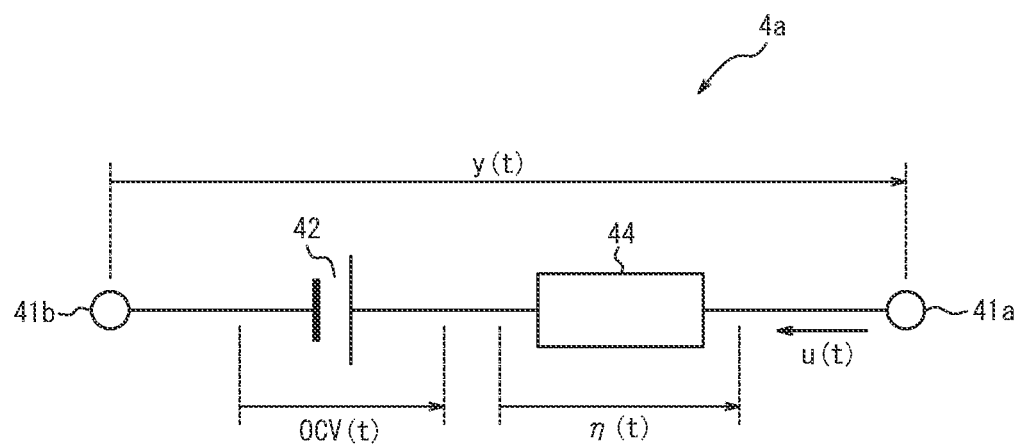
FIG. 2 is a diagram illustrating an example of a battery equivalent circuit.

The state of the battery 4 can be represented by a model that includes, as parameters, the OCV of the battery 4 and the overvoltage inside the battery 4. The model representing the state of the battery 4 is approximated by a battery equivalent circuit 4a illustrated in FIG. 2. The model approximated by the battery equivalent circuit 4a is also referred to as a battery model. The input of the battery equivalent circuit 4a corresponds to the charge/discharge current $u(t)$ flowing in the battery 4. Suppose the battery 4 is charged in the case where the charge/discharge current $u(t)$ flows in the direction of the arrow. That is, the direction of the arrow is the direction of the current for charging the battery 4. Here, $u(t)$ is a positive value in the case where the current for charging the battery 4 flows, and is a negative value in the case where the discharge current flows from the battery 4. The output of the battery equivalent circuit 4a corresponds to the terminal voltage $y(t)$ of the battery 4. The sign of $y(t)$ is specified by the direction of the arrow. In FIG. 2, in the case where the potential of a terminal 41a located on the head side of the arrow is higher than the potential of a terminal 41b located on the tail side of the arrow, $y(t)$ is a positive value. The terminals 41a and 41b respectively correspond to the positive electrode terminal and the negative electrode terminal of the battery 4.

The OCV of the battery 4 is expressed as the voltage output from a voltage source 42 in the battery equivalent circuit 4a. The voltage output from the voltage source 42 is denoted by $OCV(t)$ as a function of time. The sign of $OCV(t)$ is specified by the direction of the arrow. In FIG. 2, in the case where the potential on the head side of the arrow is higher than the potential on the tail side of the arrow, $OCV(t)$ is a positive value. $OCV(t)$ corresponds to the terminal voltage of the battery 4 in the case where no charge/discharge current flows in the battery 4. In the case where no charge/discharge current flows in the battery 4, $u(t)=0$. In the case where $u(t)=0$, $y(t)=OCV(t)$.

The overvoltage of the battery 4 is expressed as the voltage across an internal impedance 44 in the battery equivalent circuit 4a. The overvoltage of the battery 4 is denoted by $\eta(t)$ as a function of time. The sign of $\eta(t)$ is specified by the direction of the arrow. In FIG. 2, in the case where the potential on the head side of the arrow is higher than the potential on the tail side of the arrow, $\eta(t)$ is a positive value. In the case where $u(t)$ is a positive value, $\eta(t)$ is a positive value.

The terminal voltage of the battery 4 is expressed as the sum of the OCV and the overvoltage of the battery 4. That is, $y(t)=OCV(t)+\eta(t)$. In the case where the current for charging the battery 4 flows, i.e. in the case where $u(t)$ is a positive value, $\eta(t)$ is a positive value. In this case, $y(t)>OCV(t)$. In the case where the discharge current flows from the battery 4, i.e. in the case where $u(t)$ is a negative value, $\eta(t)$ is a negative value. In this case, $y(t)<OCV(t)$.

Figure 3:
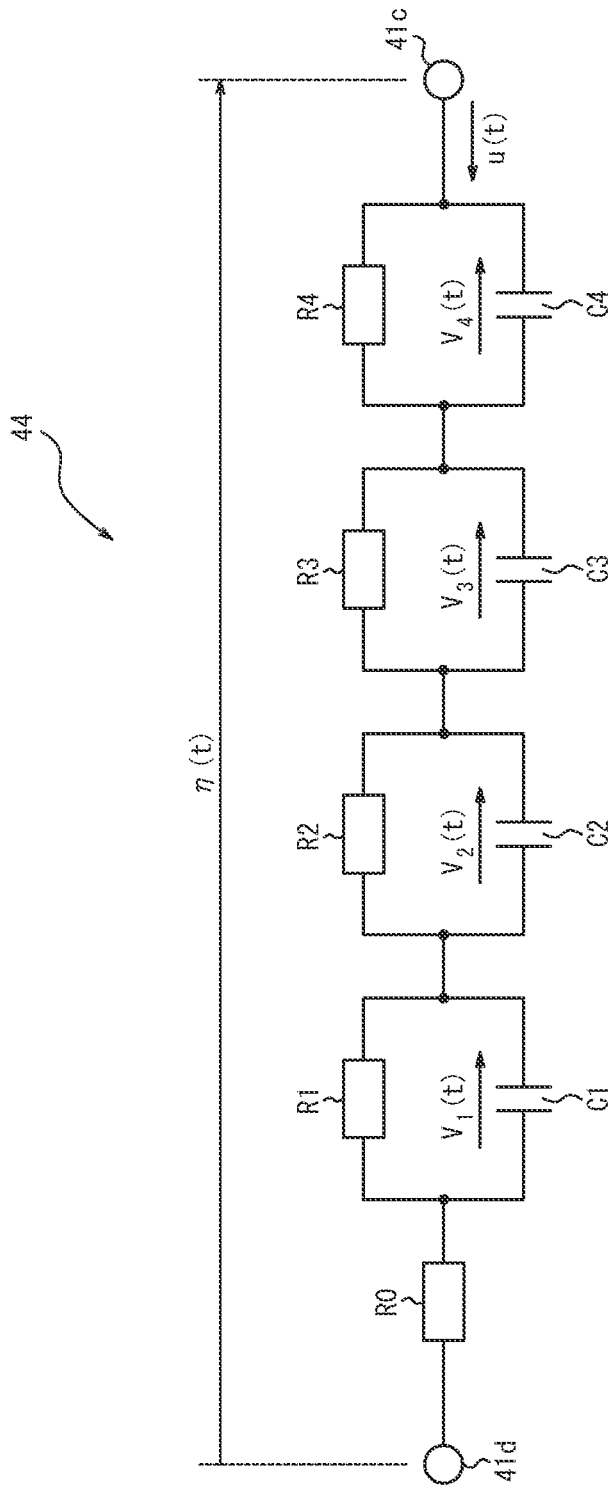
FIG. 3 is a diagram illustrating a fourth-order Foster-type RC ladder circuit.

The internal impedance 44 may be represented, for example, by a circuit in which a Warburg impedance including resistors R1 to R4 and capacitors C1 to C4 and a resistor R0 are connected in series, as illustrated in FIG. 3. The resistor R0 represents resistance caused by a migration process and the like in an electrolytic solution of the battery 4. The Warburg impedance represents impedance caused by an ion diffusion process and the like in the battery 4. The overvoltage of the battery 4 is expressed as a voltage drop that occurs in the internal impedance 44 in the battery 4 due to the current flowing in the battery equivalent circuit 4a. In FIG. 3, the potential difference between terminals 41c and 41d corresponds to the overvoltage.

The Warburg impedance is represented by a fourth-order Foster-type circuit. The fourth-order Foster-type circuit includes four parallel circuits in each of which a resistor and a capacitor are connected in parallel. The parallel circuits are connected in series. The respective four resistors and four capacitors included in the fourth-order Foster type circuit are denoted by R1 to R4 and C1 to C4. The order of the Foster type circuit representing the internal impedance 44 is not limited to the fourth order, and may be the third order or less, or the fifth order or more. The internal impedance 44 is not limited to a Foster-type circuit, and may be represented by a Cowell-type circuit or any other linear transfer function model.

The voltage drops in the respective parallel circuits are denoted by $v_1(t)$ to $v_4(t)$ each as a function of time. The voltage drop in the resistor R0 is expressed as $R0 \times u(t)$. In this case, $\eta(t)=R0 \times u(t)+v_1(t)+v_2(t)+v_3(t)+v_4(t)$.

The parameters of the battery equivalent circuit 4a that approximates the battery 4 include the resistance values of the resistors R1 to R4 and the capacitance values of the capacitors C1 to C4 in the Warburg impedance and the resistance value of the resistor R0. In this embodiment, the parameters of the battery equivalent circuit 4a are set beforehand. The parameters of the battery equivalent circuit 4a may be sequentially estimated by a Kalman filter or the like.

Figure 4:
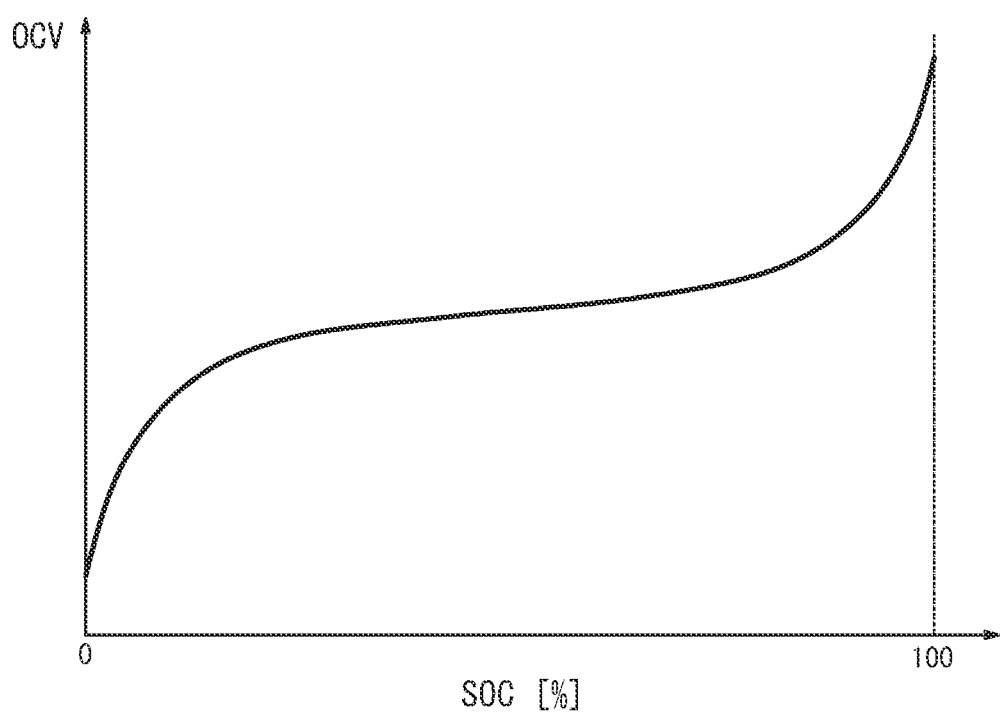
FIG. 4 is a diagram illustrating an example of SOC-OCV characteristics.

The OCV of the battery 4 is expressed as a function of the state of charge (SOC) of the battery 4. That is, the state of the battery 4 is represented by the SOC and the overvoltage of the battery 4. The SOC is expressed as the ratio of the charge amount to the charge capacity of the battery 4. The relationship between the SOC and the OCV is called SOC-OCV characteristics. For example, the SOC-OCV characteristics can be represented by a graph illustrated in FIG. 4. In FIG. 4, the horizontal axis and the vertical axis respectively represent the SOC and the OCV. The SOC-OCV characteristics may be determined by experiments or the like beforehand. The observer 10 can estimate the OCV of the battery 4 based on an estimated value of the SOC of the battery 4 and the SOC-OCV characteristics of the battery 4. The result of estimating the OCV by the observer 10 is referred to as an OCV estimated value.

The observer 10 estimates the state of the battery 4 by estimating the SOC and the overvoltage of the battery 4. The estimation results of the SOC and the overvoltage by the observer 10 are respectively referred to as an SOC estimated value and an overvoltage estimated value. The SOC is denoted by SOC(t) as a function of time. In the case where the model of the battery 4 is approximated by the battery equivalent circuit 4a, the state variables of the system include $v_1(t)$ to $v_4(t)$. Hence, the observer 10 estimates SOC(t) and $v_1(t)$ to $v_4(t)$.

The SOC and the overvoltage of the battery 4 are included in the state variables of the system representing the model of the battery 4. The observer 10 estimates the state variables of the system to thereby estimate the state of the battery 4. The observer 10 is also referred to as a state estimator. In the case where at least part of the state variables cannot be directly observed, the observer 10 estimates, based on the input and the output, each state variable that cannot be directly observed.

The observer 10 can calculate the OCV estimated value of the battery 4, based on the SOC estimated value included in the state variables of the battery 4. The observer 10 can estimate the terminal voltage of the battery 4, based on the OCV estimated value of the battery 4 and the overvoltage estimated value of the battery 4. The observer 10 acquires the measured value of the terminal voltage of the battery 4, and calculates the difference between the measured value of the terminal voltage and the estimated value of the terminal voltage as an estimation error. The observer 10 calculates a parameter for feedback on the estimated value of each state variable of the system representing the battery 4, based on the estimation error. The parameter for feedback on the estimated value of the state variable is also referred to as a state variable correction value. The observer 10 calculates the product of the estimation error and a predetermined coefficient matrix, as the state variable correction value. The predetermined coefficient matrix is also referred to as an observer gain. Each element of the observer gain may be a function of the charge/discharge current flowing in the battery, or a constant. The observer gain is set beforehand based on the parameters of the equivalent circuit representing the battery 4.

The observer 10 includes a state variable estimation unit 11, an OCV calculation unit 12, and a feedback unit 13. The feedback unit 13 includes a terminal voltage calculation unit 14, a comparator 15, and a state variable correction value calculation unit 16.

The state variable estimation unit 11 estimates the SOC and the overvoltage of the battery 4 as the state variables of the system representing the battery 4, based on the measured value u(t) of the charge/discharge current flowing in the battery 4 acquired from the current sensor 2. The state variable estimation unit 11 outputs the SOC estimated value to the OCV calculation unit 12, and outputs the overvoltage estimated value to the terminal voltage calculation unit 14. The SOC estimated value is expressed as a term with the symbol ˆabove SOC(t). The term with the symbol ˆabove SOC(t) is denoted by SOCˆ(t). The overvoltage estimated value is expressed as a term with the symbol ˆabove η(t) representing the overvoltage. The term with the symbol ˆabove η(t) is denoted by ηˆ(t).

The OCV calculation unit 12 calculates the OCV estimated value, based on the SOC estimated value acquired from the state variable estimation unit 11 and the SOC-OCV characteristics. The OCV estimated value is expressed as a term with the symbol ˆabove OCV(t). The term with the symbol ˆabove OCV(t) is denoted by OCV◯(t). The OCV calculation unit 12 outputs the OCV estimated value to the terminal voltage calculation unit 14.

The terminal voltage calculation unit 14 calculates the terminal voltage estimated value, based on the OCV estimated value and the overvoltage estimated value. The terminal voltage estimated value is expressed as a term with the symbol ˆabove y(t). The term with the symbol ˆabove y(t) is denoted by yˆ(t). The terminal voltage calculation unit 14 outputs the terminal voltage estimated value to the comparator 15.

The comparator 15 calculates the estimation error, based on the measured value y(t) of the terminal voltage of the battery 4 acquired from the voltage sensor 3 and the terminal voltage estimated value yˆ(t) acquired from the terminal voltage calculation unit 14. The estimation error is expressed as a term with the symbol above y(t). The term with the symbol ~ above y(t) is denoted by y~(t). In this case, y~(t)=y(t)−yˆ(t). The comparator 15 outputs the estimation error to the state variable correction value calculation unit 16.

The state variable correction value calculation unit 16 calculates the state variable correction value based on the estimation error and the observer gain, and outputs the state variable correction value to the state variable estimation unit 11. The state variable estimation unit 11 estimates each state variable further based on the state variable correction value to feed back the estimation error to the estimated value of the state variable. Thus, the estimated value of the state variable can be brought closer to the true value of the state variable.

The observer 10 can bring the estimated value OCV◯(t) of the OCV of the battery 4 closer to the true value, by the feedback of the estimation error. The observer 10 outputs OCV◯(t) to the operation unit 25. The operation unit 25 calculates the difference between the measured value y(t) of the terminal voltage of the battery 4 and OCV◯(t), as the overvoltage of the battery 4. The overvoltage calculated by the operation unit 25 is referred to as an overvoltage calculated value. The overvoltage calculated value is denoted by ηc(t). The operation unit 25 outputs the overvoltage calculated value ηc(t) to the response estimation unit 20. The response estimation unit 20 acquires the measured value u(t) of the charge/discharge current of the battery 4 and the overvoltage calculated value ηc(t) of the battery 4 each as time series data. The time series data may include data sampled in a predetermined cycle. The predetermined cycle may be set as appropriate. The response estimation unit 20 identifies the parameters of the system representing the battery 4, based on the time series data of u(t) and ηc(t). The response estimation unit 20 estimates the terminal voltage output from the battery 4 as the response of the system when a predetermined current is input to the battery 4, based on the identified parameters.

Figure 5:
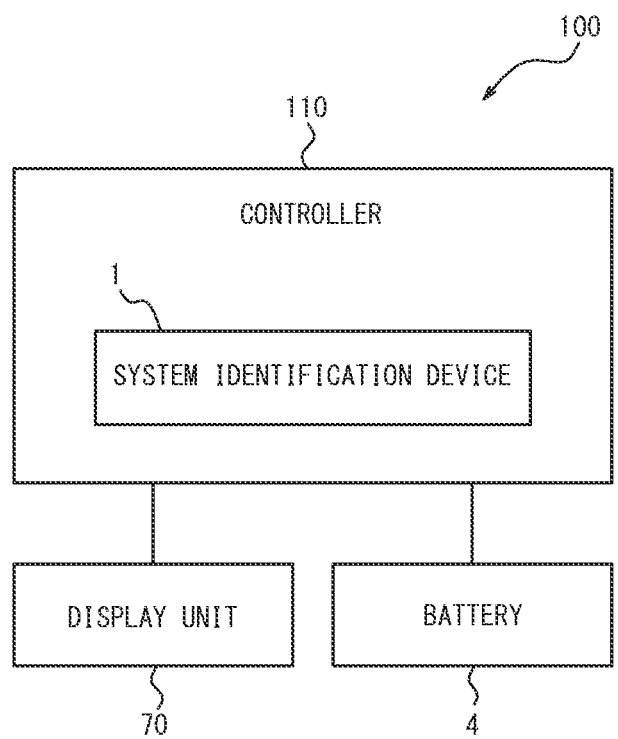
FIG. 5 is a block diagram illustrating an example of the structure of a vehicle including the system identification device.

The system identification device 1 according to one of the disclosed embodiments is, for example, installed in a vehicle 100, as illustrated in FIG. 5. Examples of the vehicle 100 include an automobile that runs by an engine driven with fuel such as gasoline or diesel, and an automobile that runs by an electric motor as a power source.

The vehicle 100 further has the battery 4 installed therein. The battery 4 supplies discharge current to a motor such as a starter motor that starts the engine and a drive motor that powers the vehicle 100. The battery 4 may be charged with power regenerated by the electric motor when braking the vehicle 100, power generated by an alternator attached to the engine, power supplied by a ground charging facility, or the like.

The vehicle 100 may include a controller 110 such as an engine control unit (ECU). The controller 110 controls the engine or the motor according to the running state of the vehicle 100. The controller 110 may be separate from the system identification device 1. In this case, the controller 110 may acquire various information such as the result of identifying the system representing the model of the battery 4, from the system identification device 1. The controller 110 may realize the functions of the system identification device 1, as part of the functions of the controller 110. In this embodiment, it is assumed that the controller 110 realizes the functions of the system identification device 1.

The vehicle 100 may further include a display unit 70. The controller 110 may cause the display unit 70 to display various information relating to the vehicle 100. The display unit 70 may, for example, display information about the state of the battery 4. Thus, the vehicle 100 can provide various information to the driver.

The controller 110 discharges or charges the battery 4, depending on the operation of the vehicle 100 such as starting or stopping. That is, the charge/discharge current of the battery 4 changes depending on the operation of the vehicle 100. In the case where the charge/discharge current of the battery 4 changes, the overvoltage representing the voltage drop in the internal impedance 44 of the battery 4 changes. The internal impedance 44 of the battery 4 is included in the parameters of the system representing the model of the battery 4. That is, the overvoltage of the battery 4 is determined based on the parameter of the system representing the model of the battery 4 and the charge/discharge current of the battery 4.

The battery 4 supplies the starter motor with the current required to drive the starter motor so that, for example, the starter motor can start the engine of the automobile. In this case, the current discharged by the battery 4 increases rapidly, and the overvoltage of the battery 4 increases. In the case where the battery 4 discharges, the terminal voltage of the battery 4 is expressed as a voltage obtained by subtracting the overvoltage from the open circuit voltage. That is, the terminal voltage of the battery 4 decreases with an increase in the discharge current. The decrease in the terminal voltage of the battery 4 may make it impossible for the battery 4 to supply the current required for driving the starter motor.

The controller 110 may cause the engine to perform an idling stop when the vehicle 100 is stopped. The controller 110 may determine whether the engine can be restarted after causing the engine perform the idling stop, and, in the case of determining that the engine can be restarted, cause the engine to perform the idling stop. The controller 110 may determine whether the engine can be restarted, based on the state of the battery 4. In other words, the controller 110 may determine whether to cause the engine to perform the idling stop based on the state of the battery 4.

In the case where the internal resistance of the battery 4 when the battery 4 begins to discharge is high, the battery 4 may be unable to supply the current required to restart the engine. The controller 110 may estimate the output of overvoltage corresponding to the input of predetermined current. The controller 110 may input, to the system, the current supplied by the battery 4 to restart the engine as the predetermined current, estimate the overvoltage as the response of the system, and determine whether the predetermined current can be supplied based on the estimation result.

The controller 110 may determine whether the engine can be restarted, by estimating the internal resistance of the battery 4 when the battery 4 begins to discharge. The controller 110 may determine whether the engine can be restarted, based on the internal resistance of the battery 4 t seconds after the time at which the battery 4 begins to discharge. The internal resistance of the battery 4 t seconds after the time at which the battery 4 begins to discharge is referred to as a t-second value resistance. The controller 110 may determine that the engine can be restarted, in the case where the t-second value resistance is less than a determination reference value. The determination reference value may be set based on the magnitude of current that can be supplied by the battery 4. The determination reference value is not limited to such, and may be set as appropriate.

For example, the battery 4 needs to discharge the current for driving the motor at least for the time for cranking when the engine restarts from an idling stopped state. The time required for the engine to crank is also referred to as a cranking time. For example, the cranking time is set to 0.1 seconds. In this case, the controller 110 may determine that the engine can be restarted from the idling stopped state in the case where the t-second value resistance when the cranking time is set to t seconds is less than the determination reference value.

For example, a vehicle including an engine and a motor may drive the motor to assist the engine according to need during running of the engine. Such a vehicle is also called a parallel hybrid vehicle. If the parallel hybrid vehicle is under a heavy engine load during, for example, acceleration or climbing, the battery 4 needs to discharge the current for driving the motor for the time during which the motor assists the engine. The time during which the motor assists the engine is also referred to as an assist time. The assist time is set to, for example, 10 seconds. In this case, the controller 110 may determine that the motor can assist the engine in the case where the t-second value resistance when the assist time is set to t seconds is less than the determination reference value. The controller 110 may calculate the time during which the motor can assist the engine, by calculating the value of t so as to satisfy the condition that the t-second value resistance is less than the determination reference value. The controller 110 can continuously estimate the time during which the motor can assist the engine, by sequentially updating the t-second value resistance corresponding to the assist time.

For example, a vehicle including an engine and a motor may, while running by the motor, generate power from the engine to supply power to the motor and charge the battery 4. Such a vehicle is also called a series hybrid vehicle. The series hybrid vehicle has, as running modes, an EV mode in which the vehicle runs by driving the motor with only the power of the battery 4 and a hybrid mode in which the vehicle runs by driving the motor with the power of the battery 4 and the power generated by the engine. In the series hybrid vehicle, the running mode is often preferentially set to the EV mode, in order to save the power generated by the engine as much as possible. The battery 4 needs to discharge the current for driving the motor for the time during which the vehicle runs in the EV mode. The time during which the vehicle runs in the EV mode is also referred to as an EV running time. The EV running time is set to, for example, 10 seconds. In this case, the controller 110 may determine that the vehicle can run in the EV mode in the case where the t-second value resistance when the EV running time is set as t seconds is less than the determination reference value. The controller 110 may calculate the time during which the vehicle can run in the EV mode, by calculating the value of t so as to satisfy the condition that the t-second value resistance is less than the determination reference value. The controller 110 can continuously estimate the time during which the vehicle can run in the EV mode, by sequentially updating the t-second value resistance corresponding to the EV running time.

The controller 110 may acquire the terminal voltage of the battery 4 output by the system representing the model of the battery 4 in the case where a predetermined current is input to the system. The controller 110 may calculate the ratio of the terminal voltage of the battery 4 and the predetermined current t seconds after the time at which the input of the predetermined current to the system begins, as the t-second value resistance.

The controller 110 can determine with high accuracy whether the engine can be restarted, by calculating the t-second value resistance of the battery 4 with high accuracy. Consequently, the controller 110 can determine with high accuracy whether to cause the engine to perform the idling stop. The controller 110 may display the determination result of whether to cause the engine to perform the idling stop, on the display unit 70.

In this embodiment, the controller 110 estimates an overvoltage output in the case where a step current is input to the battery 4. The step current is expressed as a current that does not flow before a predetermined time and flows at a constant value from the predetermined time onwards. The overvoltage output as a response to the input of the step current is referred to as a step response. In the case where the constant value is 1 ampere, the step response after t seconds represents the t-second value resistance.

To estimate the t-second value resistance of the battery 4 with high accuracy, the overvoltage of the battery 4 output from the system representing the battery model in the case where a current is input to the system needs to be estimated with high accuracy. The system identification device 1 can estimate the output of the system in response to predetermined input with high accuracy, by applying, to the system, an input/output model that specifies the relationship between the input and the output of the system and identifying the parameters of the input/output model applied.

In this embodiment, the system representing the battery model is assumed to be a discrete time system. The sampling cycle in the discrete time system is denoted by Ts. The input and the output in the continuous time system are respectively denoted by u(t) and y(t), using time t. The input and the output in the discrete time system are respectively denoted by u[k] and y[k], where k denotes the number of sampling steps. Here, t=kTs. Suppose the input of current to the system starts at the time (t=0) corresponding to k=0. t=0 is also referred to as an input start time. When estimating the output y[k] in the kth step, the time (t=kTs) corresponding to the kth step is referred to as an estimation target time. The estimation target time is after the input start time.

In this embodiment, the input/output model is approximated by a predetermined model. The predetermined model is represented by a linear transfer function. By identifying the parameters of the transfer function representing the predetermined model, the system identification device 1 can estimate the response after t seconds.

<ARX Model>

It is assumed that an autoregressive exogenous (ARX) model is applied as the predetermined model that approximates the input/output model. The ARX model can represent the system by a finite number of parameters.

The ARX model is described by a difference equation expressed by the following Formula (1):

[Math. 1]

$$y[k] = -a_1 \cdot y[k-1] - \ldots - a_{n_a} \cdot y[k-n_a] + \quad (1)$$
$$b_0 \cdot u[k] + b_1 \cdot u[k-1] + \ldots + b_{n_b} \cdot u[k-n_b] + w[k]$$
$$= -\sum_{i=1}^{n_a} a_i \cdot y[k-i] + \sum_{i=0}^{n_b} b_i \cdot u[k-i] + w[k],$$

where $a_1$ to $a_{n_a}$ and $b_0$ to $b_{n_b}$ are the parameters of the ARX model, $n_a$ and $n_b$ denote the order of the ARX model, and w[k] is white noise whose mean value is 0.

A parameter vector θ and a data vector ψ of the ARX model are respectively expressed by the following Formulas (2) and (3):

[Math. 2]

$$\theta = [a_1 \ldots a_{n_a} \, b_0 \, b_1 \ldots b_{n_b}]^T \quad (2)$$

[Math. 3]

$$\psi[k] = [-y[k-1] \ldots -y[k-n_a] u[k] u[k-1] \ldots u[k-n_b]]^T \quad (3),$$

where T denotes a transposed matrix.

As a result of applying Formulas (2) and (3) to Formula (1), Formula (1) is transformed into the following Formula (4):

[Math. 4]

$$y[k] = \theta^T \cdot \psi[k] + w[k] \quad (4).$$

The model expressed by Formula (4) is called a linear regression model. The system identification device 1 can estimate the parameter vector θ of the linear regression model, by analyzing the input data and the output data of the system by a method such as the least squares method. The system identification device 1 can calculate the t-second value resistance as the response of the system based on the ARX model to which the estimated parameters are applied.

The estimation of the parameters in the ARX model corresponds to the estimation of the parameters of the transfer function.

The number of parameters in the ARX model represents the order of the ARX model. If the order of the ARX model is different from the order of the true system, the estimation error of the parameters increases. As a result, the estimation error of the t-second value resistance calculated as the response of the system increases.

<FIR Model>

Suppose a finite impulse response (FIR) model is applied as the predetermined model that approximates the input/output model. The FIR model can represent the response after t seconds, as the sum of the impulse responses at the sampling times up to t seconds after the start time. The t-second value resistance is expressed as the sum of the impulse responses to the input at the respective times up to t seconds before the time of estimating the resistance value. The system identification device 1 can easily calculate the t-second value resistance by applying the FIR model.

The FIR model is described by a difference equation expressed by the following Formula (5):

[Math. 5]

$$y[k] = b_0 \cdot u[k] + b_1 \cdot u[k-1] + \ldots + b_{n_f} \cdot u[k-n_f] + w[k] \quad (5)$$
$$= \sum_{i=0}^{n_f} b_i \cdot u[k-i] + w[k]$$

where $b_0$ to $b_{nf}$ are the parameters of the FIR model, and $n_f$ denotes the number of terms of the FIR model. That is, the FIR model expressed by Formula (5) is truncated within $(n_f+1)$ impulse responses. w[k] is white noise that is independent of u[k] and whose mean value is 0.

The FIR model is represented by a linear regression model, as with the ARX model. The system identification device 1 can estimate the parameters of the linear regression model, by analyzing the input data and the output data of the system by a method such as the least squares method. The system identification device 1 can calculate the t-second value resistance based on the impulse responses calculated as the parameters of the FIR model, by setting of denoting the number of terms of the FIR model so that t≤Ts·$n_f$. The estimation of the impulse responses in the FIR model corresponds to the estimation of the parameters of the transfer function.

If there is no noise, the impulse response g[k] of the FIR model is expressed by the following Formula (6):

[Math. 6]

$$g[k] = \sum_{i=0}^{n_f} b_i \cdot \delta[k-i] = b_k. \quad (6)$$

In detail, the parameter $b_i$ of the FIR model is equal to g[i] that denotes the value after the ith step of the impulse response g[k] of the system. As a result of applying Formula (6) to Formula (5), Formula (5) is transformed into the following Formula (7). Formula (7) represents a value calculated as the output of the system in the case where the FIR model is applied.

[Math. 7]

$$y[k] = \sum_{i=0}^{n_f} g[i] \cdot u[k-i] + w[k]. \quad (7)$$

The system identification device 1 can estimate the output of the system by estimating the impulse response as a parameter of the FIR model, regardless of the order of the system.

The true output of the system, on the other hand, is expressed by the convolution of the impulse response g[k] and the input u[k] of the system indicated by the following Formula (8):

[Math. 8]

$$y[k] = \sum_{i=0}^{\infty} g[i] \cdot u[k-i]. \quad (8)$$

According to Formula (8), the true output of the system is described as the sum of an infinite number of impulse responses. According to Formula (7), on the other hand, the output of the system represented by the FIR model is truncated within $(n_f+1)$ impulse responses, where $(n_f+1)$ is a finite number. That is, the output of the system represented by the FIR model contains an error caused by at least truncated terms, with respect to the true output of the system. The system identification device 1 can reduce the error by increasing the value of $n_f$. However, when the value of $n_f$ is larger, the number of parameters to be identified by the system identification device 1 is larger. An increase in the number of parameters causes an increase in the load of the system identification device 1.

<μ-Markov Model>

In this embodiment, a μ-Markov model is applied as the predetermined model that approximates the input/output model. The μ-Markov model is expressed as a model combining the ARX model and the FIR model.

The μ-Markov model in the discrete time system is described in the form indicated by the following Formula (9):

[Math. 9]

$$y[k] = \sum_{i=0}^{\mu} h_i \cdot u[k-i] + \sum_{i=\mu+1}^{\mu+p} b'_i \cdot u[k-i] - \sum_{i=\mu+1}^{\mu+p} a'_i \cdot y[k-i] + w[k], \quad (9)$$

where u[k] and y[k] respectively denote the input and the output of the system.

The first term on the right side of Formula (9) represents the FIR model. $h_i$ (i∈{0, . . . , μ}) denotes the impulse response of the system. In this case, the number of terms described in the impulse response is (μ+1). If the model of the battery 4 does not have a direct term, $h_0$=0. The second and third terms on the right side of Formula (9) represent the ARX model. $a'_i$ and $b'_i$ (i∈{(μ+1), . . . , μ+p}) are parameters of the ARX model. p denotes the order of the ARX model. w[k] is white noise that is independent of u[k] and whose mean value is 0.

The μ-Markov model is represented by a linear regression model, as with the ARX model or the FIR model. The system identification device 1 can estimate the parameters of the linear regression model, by analyzing the input data and the output data of the system by a method such as the least squares method.

The μ-Markov model determines the output y[k] of the kth step, based on (μ+1) inputs included in the period from the kth step back to the (k−μ)th step and p inputs and outputs included in the period from the (k−μ−1)th step back to the (k−μ−p)th step. That is, the parameters of the system representing the battery 4 are identified based on the time series data of the input and the output in the predetermined period. The input and the output correspond respectively to the current flowing in the battery 4 and the overvoltage of the battery 4. The predetermined period corresponds to the period from the kth step to the (k−μ−p)th step.

The (μ+1) inputs in the period from the kth step to the (k−μ)th step are reflected in the output y[k] based on the terms of the FIR model included in the μ-Markov model. The period from the kth step to the (k−μ)th step is referred to as a first period. That is, the system identification device 1 estimates the overvoltage at the estimation target time based on the value estimated by applying, to the FIR model, the input in the first period from the estimation target time back to the past.

The p inputs and outputs in the period from the (k−μ−1)th step back to the (k−μ−p)th step are reflected in the output y[k] based on the terms of the ARX model included in the μ-Markov model. The period from the (k−μ−1)th step to the (k−μ−p)th step is referred to as a second period. That is, the system identification device 1 estimates the overvoltage at the estimation target time based on the value estimated by applying, to the ARX model, the input in the second period further back from the first period. In the μ-Markov model, the estimation error of the output caused by the application of the FIR model in the system is corrected by the application of the ARX model.

Figure 6:
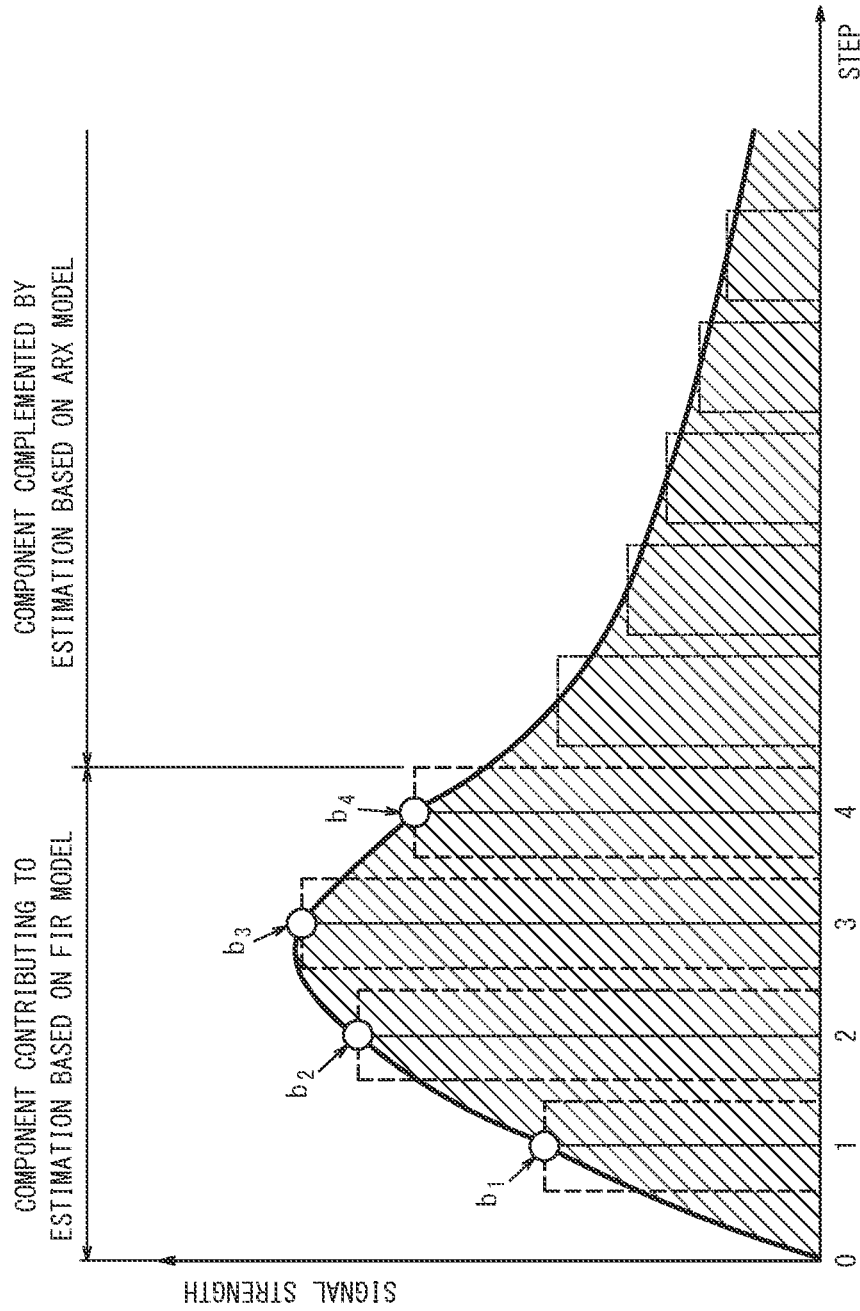
FIG. 6 is a diagram illustrating the concept of a μ-Markov model.

The concept of the μ-Markov model will be described below, with reference to FIG. 6. The graph in FIG. 6 illustrates the concept of calculating the estimated value of the output of the system at the estimation target time by integrating the component of the impulse response to the input at each time in past. The horizontal axis of the graph represents the step in the discrete time system. A larger step number corresponds to a step further back to the past from the estimation target time. The vertical axis of the graph represents the signal strength of the impulse response. The estimated value of the output is calculated by calculating the product of the signal strength of the impulse response and the sampling cycle Ts in each step and integrating the values calculated in the respective steps.

The estimated value of the output can be brought closer to the true value, by integrating the components of the impulse responses to the inputs in steps infinitely back to the past. In the graph in FIG. 6, the area of the part hatched with diagonal lines rising to the right represents the true value of the output at the estimation target time. However, a number of steps subjected to integration is truncated within a finite number. The components integrated in the FIR model are designated by the dashed rectangles. In the FIR model, the impulse responses of four steps back from the estimation target time are integrated. The signal strengths of the impulse responses to the inputs in the respective steps are denoted by $b_1$ to $b_4$. The components integrated in the FIR model can be regarded as components that contribute to the estimation based on the FIR model.

In the case where the FIR model is truncated within a finite number of steps subjected to integration, the components of the impulse responses to the inputs in the steps further back to the past from the steps within the truncation range are not integrated in the FIR model, and are not reflected in the estimated value of the output. In FIG. 6, the components not reflected in the estimated value of the output in the FIR model are designated by the dashed-two dotted rectangles. The components designated by the dashed-two dotted rectangles are reflected in the estimated value of the output if the number of steps integrated in the FIR model is increased. That is, when the number of steps integrated in the FIR model is larger, a value closer to the true value is calculated as the output of the system. As described above, in the case where, in the estimation of the parameters of the μ-Markov model based on the input data and the output data of the system, the parameters are estimated with only the terms representing the FIR model, the estimation error of the parameters of the FIR model occurs. In other words, the estimation error of the parameters of the FIR model is caused by the truncation of the FIR model within a finite number of terms.

By taking the terms representing the ARX model into account, the estimation error of the parameters of the FIR model is reduced. That is, the estimated values of the parameters of the FIR model are brought closer to the true values. The components not reflected in the estimated value of the output in the FIR model, which are designated by the dashed-two dotted rectangles in FIG. 6, are reflected in the estimated value of the output as the terms representing the ARX model. Thus, the estimation based on the ARX model can complement the components not reflected in the estimated value of the output in the FIR model. In this way, the system identification device 1 can bring the estimated values of the parameters of the FIR model closer to the true values based on the ARX model composed of a finite number of terms. Consequently, the output of the system based on the impulse response estimated by applying the μ-Markov model is brought closer to the true value than the output of the system based on the impulse response estimated by applying only the FIR model. In other words, the terms that are supposed to continue infinitely but truncated in the FIR model are substituted by the finite number of terms constituting the ARX model. This can make the parameter estimation result closer to the true value without increasing the number of terms in the FIR model infinitely. In other words, the system identification device 1 can identify the system with high accuracy by applying the FIR model and the ARX model.

By applying the μ-Markov model to the system, the system identification device 1 can estimate the impulse responses for a finite time with high accuracy regardless of the true order of the system. The t-second value resistance is calculated based on the sum of the impulse responses for a finite time. By applying the μ-Markov model to the system representing the model of the battery 4, the system identification device 1 can estimate the t-second value resistance of the battery 4 as the response of the system with high accuracy. The system identification device 1 can calculate the t-second value resistance as the ratio of the overvoltage estimated value at the estimation target time and the predetermined current input at the estimation target time.

<Example of Battery Estimation>

In this example, the system identification device 1 applies the μ-Markov model to the system representing the battery model illustrated in FIGS. 2 and 3, to identify the parameters of the system.

Formula (9) includes (μ+1) parameters ($h_0$ to $h_\mu$) representing the impulse response and 2p parameters ($a_{\mu+1}$ to $a_{\mu+p}$ and $b_{\mu+1}$ to $b_{\mu+p}$) included in the ARX model. The system identification device 1 can identify the system by estimating ($\mu+2p+1$) parameters.

The system identification device 1 can estimate each parameter of the system based on an equation derived from a data set in which $u(t)$ and $\eta c(t)$ are associated with each other. In the case where a number of unknown parameters is Q, the parameters can be calculated analytically based on a system of equations including at least Q equations. The $\mu$-Markov model has ($\mu+2p+1$) unknown parameters. Hence, at least ($\mu+2p+1$) equations are needed in order to analytically calculate the parameters of the $\mu$-Markov model. One equation is derived based on one data set in which $u(t)$ and $\eta c(t)$ are associated with each other. Hence, at least ($\mu+2p+1$) data sets are needed.

For example, the system identification device 1 may acquire ($\mu+2p+1$) or more data sets in each of which the input and the output of the system are associated with each other. In the case where the system identification device 1 acquires ($\mu+2p+1$) or more data sets, the system identification device 1 can set equations including at least ($\mu+2p+1$) parameters as unknowns. By solving the equations, the system identification device 1 can analytically calculate the ($\mu+2p+1$) parameters. The system identification device 1 can calculate the parameters of the system with high accuracy by acquiring ($\mu+2p+1$) or more sets of data.

The system identification device 1 may acquire the measured value $u(t)$ of the current input to the system for T seconds and the overvoltage calculated value $\eta c(t)$ corresponding to the input current, by sampling at predetermined timing. In the case where the system identification device 1 acquires $u(t)$ and $\eta c(t)$ in the sampling cycle Ts, T denoting the data acquisition period is set to a value greater than the product of Ts and ($\mu+2p+1$) which is the number of sets of data required for the identification of the system.

When the system identification device 1 acquires more $u(t)$ and $\eta c(t)$, the estimated values of the $\mu$ parameters representing the impulse responses can be brought closer to the true values. That is, the parameters of the FIR model can be estimated asymptotically for the true values. Meanwhile, the estimated values of the 2p parameters included in the ARX model may not approach the true values regardless of the number of data sets of $u(t)$ and $\eta c(t)$. There is thus a possibility that the parameters of the ARX model have an error greater than or equal to a predetermined value with respect to the true values.

The system identification device 1 calculates the overvoltage output from the system in response to the input of predetermined current, based on the identified parameters of the $\mu$-Markov model. In this embodiment, suppose no current is input before the input start time, and the predetermined current is input from the input start time onwards. That is, suppose no current is input to the system before the first step, and the predetermined current is input to the system from the first step onwards. In this case, the system identification device 1 can calculate the overvoltage as the response of the system. The system identification device 1 can calculate the overvoltage with high accuracy, by calculating the overvoltage based on the parameters of the $\mu$-Markov model. Consequently, the overvoltage of the battery 4 at the discharge start can be estimated with high accuracy.

In the case where the predetermined current is input to the system for t seconds from the input start time to the estimation target time, the system identification device 1 can calculate the t-second value resistance based on the overvoltage at the estimation target time and the predetermined current input to the battery 4 at the estimation target time. The system identification device 1 may calculate the ratio between the overvoltage and the predetermined current, as the t-second value resistance. The system identification device 1 can calculate the t-second value resistance with high accuracy, by calculating the overvoltage with high accuracy. In the case where the system identification device 1 is installed in the vehicle 100, as a result of the system identification device 1 calculating the t-second value resistance with high accuracy, the controller 110 can determine with high accuracy whether to cause the engine to perform the idling stop.

In the case where the predetermined current input from the input start time onwards is a current of a constant value, the system identification device 1 can calculate the overvoltage as the step response of the system. The system identification device 1 can calculate the overvoltage in the case where the current of the constant value is input to the system for t seconds, as the t-second value resistance. In other words, in the case where the overvoltage is calculated as the step response after t seconds, the calculated overvoltage is taken to be the t-second value resistance. In this way, the system identification device 1 can easily calculate the t-second value resistance.

Regarding the number ($\mu+1$) of terms described in the impulse response, in the case where the condition $\mu \geq t/Ts$ is satisfied, the system identification device 1 can calculate the t-second value resistance based only on the parameters of the impulse responses. That is, in the case where the number of sets of data applied to the FIR model in the time series data is greater than or equal to a number (corresponding to t/Ts+1) obtained by adding 1 to a number (corresponding to t/Ts) obtained by dividing the period from the input start time to the estimation target time by the sampling cycle, the system identification device 1 can calculate the t-second value resistance based only on the parameters of the impulse responses. In other words, in the case where the first period is set to be longer than or equal to the period from the input start time to the estimation target time, the system identification device 1 can calculate the t-second value resistance based only on the parameters of the impulse responses. Specifically, the system identification device 1 may calculate the t-second value resistance, as a value obtained by adding the coefficient hi in the first term (representing the FIR model) on the right side in Formula (9) in the range of i=0 to $\mu$. That is, the system identification device 1 may calculate, as the internal resistance of the battery 4 at the estimation target time, the sum of the coefficients of the terms, included in the period from the input start time to the estimation target time, of the FIR model applied to identify the system. The coefficients of the terms of the FIR model correspond to the parameters of the impulse responses. In other words, the system identification device 1 may calculate, as the internal resistance of the battery 4 at the estimation target time, the sum of the coefficients of the terms from the term corresponding to the input at the estimation target time to the term corresponding to the input at the input start time of the terms included in the model of the battery 4 applied to identify the system.

By calculating the t-second value resistance based only on the parameters of the impulse responses, the system identification device 1 can calculate the t-second value resistance without based on the parameters of the ARX model that may have an error greater than or equal to a predetermined value with respect to the true values. Consequently, the system identification device 1 can estimate the t-second value resistance with high accuracy, regardless of the estimation accuracy of the parameters of the ARX model.

The number of sets of data applied to the FIR model in the time series data may be equal to a number (corresponding to μ+1) obtained by adding 1 to a number (corresponding to μ) obtained by dividing the period from the input start time to the estimation target time by the sampling cycle. In other words, the system identification device 1 may set the first period to be equal in length to the period from the input start time to the estimation target time. Thus, the number of parameters of the FIR model decreases in the range in which the t-second value resistance is calculated based only on the parameters of the impulse responses. The decrease in the number of parameters contributes to a reduced load in parameter estimation.

Figure 7:
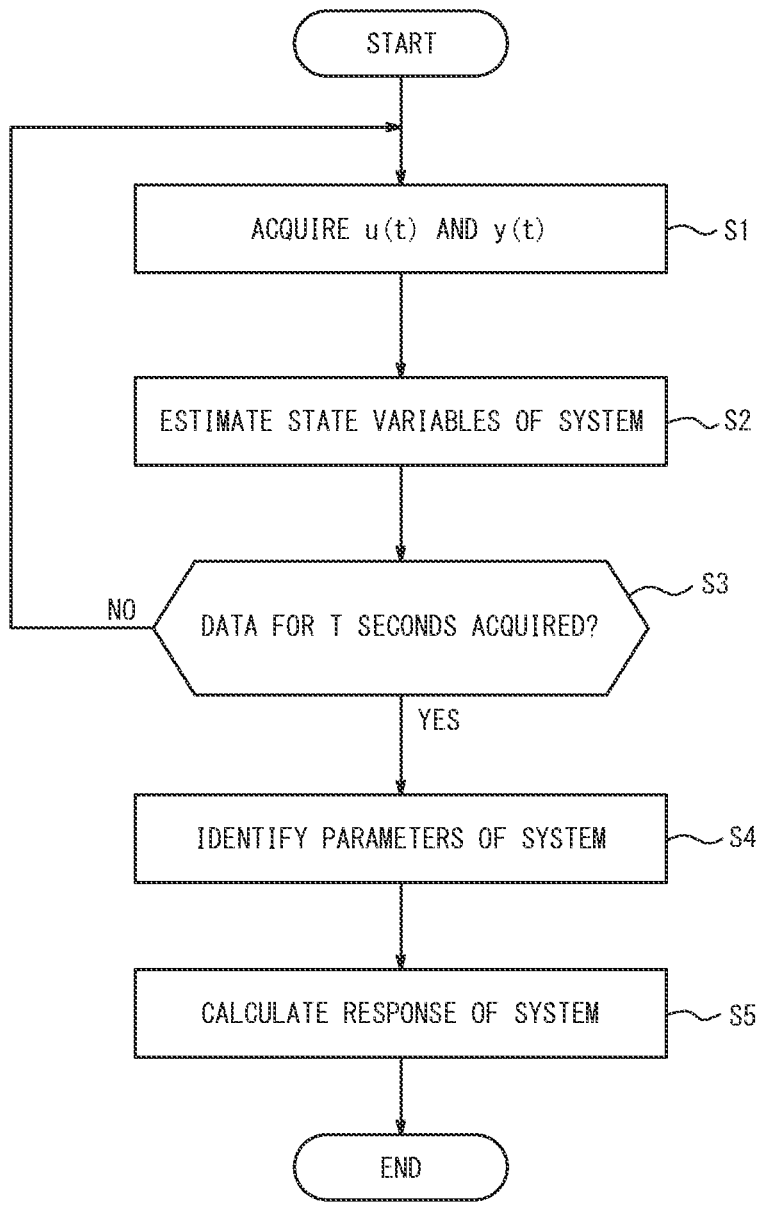
FIG. 7 is a flowchart illustrating an example of a system identification method.

The system identification device 1 and the observer 10 and the response estimation unit 20 included in the system identification device 1 may, for example, execute a system identification method including the procedure illustrated in the flowchart in FIG. 7.

The observer 10 acquires the measured value u(t) of the current flowing in the battery 4 and the measured value y(t) of the terminal voltage of the battery 4 (step S1). The observer 10 acquires u(t) from the current sensor 2. The current flowing in the battery 4 includes at least one of the current output from the battery 4 by discharge and the current input to charge the battery 4. The observer 10 acquires y(t) from the voltage sensor 3.

The observer 10 estimates the state variables of the system representing the battery model, based on u(t) and y(t) (step S2). The observer 10 calculates the SOC estimated value SOC^(t) in the state variable estimation unit 11, and the OCV estimated value OCV◯(t) in the OCV calculation unit 12. The system identification device 1 calculates the difference between OCV◯(t) and y(t) as the overvoltage calculated value ηc(t) in the operation unit 25. The system identification device 1 holds data combining u(t) and ηc(t). The system identification device 1 may store the data in the storage unit.

The system identification device 1 determines whether data for a period of T seconds is acquired (step S3). Here, T is a value greater than the product of the sampling cycle Ts and the number of sets of data required for the identification of the system.

In the case where data for a period of T seconds is not acquired (step S3: NO), the system identification device 1 returns to step S1.

In the case where data for a period of T seconds is acquired (step S3: YES), the system identification device 1 identifies the parameters of the system representing the battery model in the response estimation unit 20 (step S4). The response estimation unit 20 identifies the system based on the acquired data of T seconds. The response estimation unit 20 identifies the parameters of the μ-Markov model representing the system, based on the acquired data of T seconds.

The response estimation unit 20 estimates the response in the case where a predetermined current is input to the identified system (step S5). The response estimation unit 20 may calculate the overvoltage of the battery 4 as the response of the system. The response estimation unit 20 can calculate, as the overvoltage, a value obtained by integrating the product of the impulse response and the instantaneous value of the predetermined current at each sampling time up to t seconds after the current input start time. In the case where the predetermined current input to the system is a constant value, the response estimation unit 20 can calculate the sum of the impulse responses at the respective sampling times as the t-second value resistance.

The system identification device 1 can estimate the t-second value resistance of the battery 4, using the model of the battery 4 illustrated in FIGS. 2 and 3 as the target system. The order of the model illustrated in FIGS. 2 and 3 is the fourth order. Accordingly, the order of the target system is the fourth order. For example, by setting t to 1, the system identification device 1 can calculate the 1-second value resistance.

As an example, suppose the respective parameters of the internal impedance 44 in the battery 4 illustrated in FIG. 3 are set to the following values:

R0=3.6 mΩ
R1=2.19 mΩ
R2=0.243 mΩ
R3=8.75×10$^{-2}$ mΩ
R4=4.47×10$^{-2}$ mΩ
C1 to C4=6.72 kF.

Also suppose the sampling cycle Ts is set to 0.1 seconds. In such a case, as a result of μ being set to 10 or more, the 1-second value resistance is calculated based only on the parameters of the impulse responses.

In the case where the target system is discretized assuming zero-order hold for the input signal to the target system, the following Formula (10) is derived as a discrete time transfer function:

[Math. 10]

$$\frac{0.0036q^4 - 0.013q^3 + 0.016q^2 - 0.0093q + 0.0020}{q^4 - 3.5q^3 + 4.6q^2 - 2.6q + 0.56}. \quad (10)$$

By applying each of the μ-Markov model, the ARX model, and the FIR model to the target system assumed as described above, the estimation result of the 1-second value resistance in each model can be calculated. Here, the true value of the 1-second value resistance is 3.9699 mΩ.

In Case 1, the order p of the ARX model and the order p of the ARX model included in the μ-Markov model were each set to the fourth order which is the order of the true system. $n_f$ denoting the number of terms of the impulse response of the FIR model and μ denoting the number of terms of the impulse response included in the μ-Markov model were each set to 10. As data used to identify the parameters of the target system, Gaussian white noise of a mean value of 0 and a variance of $1.0 \times 10^{-7}$ was added, as observation noise, to the measured value of the terminal voltage of the battery 4 representing the output of the target system.

The parameters of each model were identified under the condition that 1000 different types of noise were added. In each model, the 1-second value resistance was estimated based on the identified parameters. The estimation result of the 1-second value resistance for the 1000 different types of noise, in mΩ, was as follows:

μ-Markov model: mean value 3.9686, standard deviation±$3.6892 \times 10^{-3}$
ARX model: mean value 4.0131, standard deviation±$5.7713 \times 10^{-3}$
FIR model: mean value 3.9609, standard deviation±$2.9357 \times 10^{-3}$.

In Case 2, the order p of the ARX model and the order p of the ARX model included in the μ-Markov model were each set to the second order different from the fourth order which is the order of the true system. The estimation result of the 1-second value resistance for the 1000 different types of noise in Case 2, in mΩ, was as follows:

μ-Markov model: mean value 3.9691, standard deviation±3.6603×10⁻³

ARX model: mean value 3.9887, standard deviation±6.4469×10⁻³

FIR model: mean value 3.9609, standard deviation±2.9357×10⁻³.

As can be seen from these results, the estimated value of the 1-second value resistance in the case of applying the μ-Markov model is closer to the true value than the estimated value of the 1-second value resistance in the case of applying the ARX model or the FIR model. That is, the estimation accuracy of the 1-second value resistance in the case of applying the μ-Markov model is higher than the estimation accuracy of the 1-second value resistance in the case of applying the ARX model or the FIR model.

In this example, as a result of μ that denotes the number of terms of the impulse response of the μ-Markov model being set to 10, the 1-second value resistance based on the μ-Markov model was calculated as the sum of the impulse responses from the 0th step to the 10th step. That is, the 1-second value resistance was calculated without based on the parameters of the ARX model. Hence, the estimation accuracy of the 1-second value resistance based on the μ-Markov model does not depend on whether the order of the ARX model matches the order of the true system (Case 1) or does not match the order of the true system (Case 2). The result thus obtained indicates that the estimation accuracy of the 1-second value resistance based on the μ-Markov model is higher than the estimation accuracy of the 1-second value resistance based on the ARX model.

Figure 8:
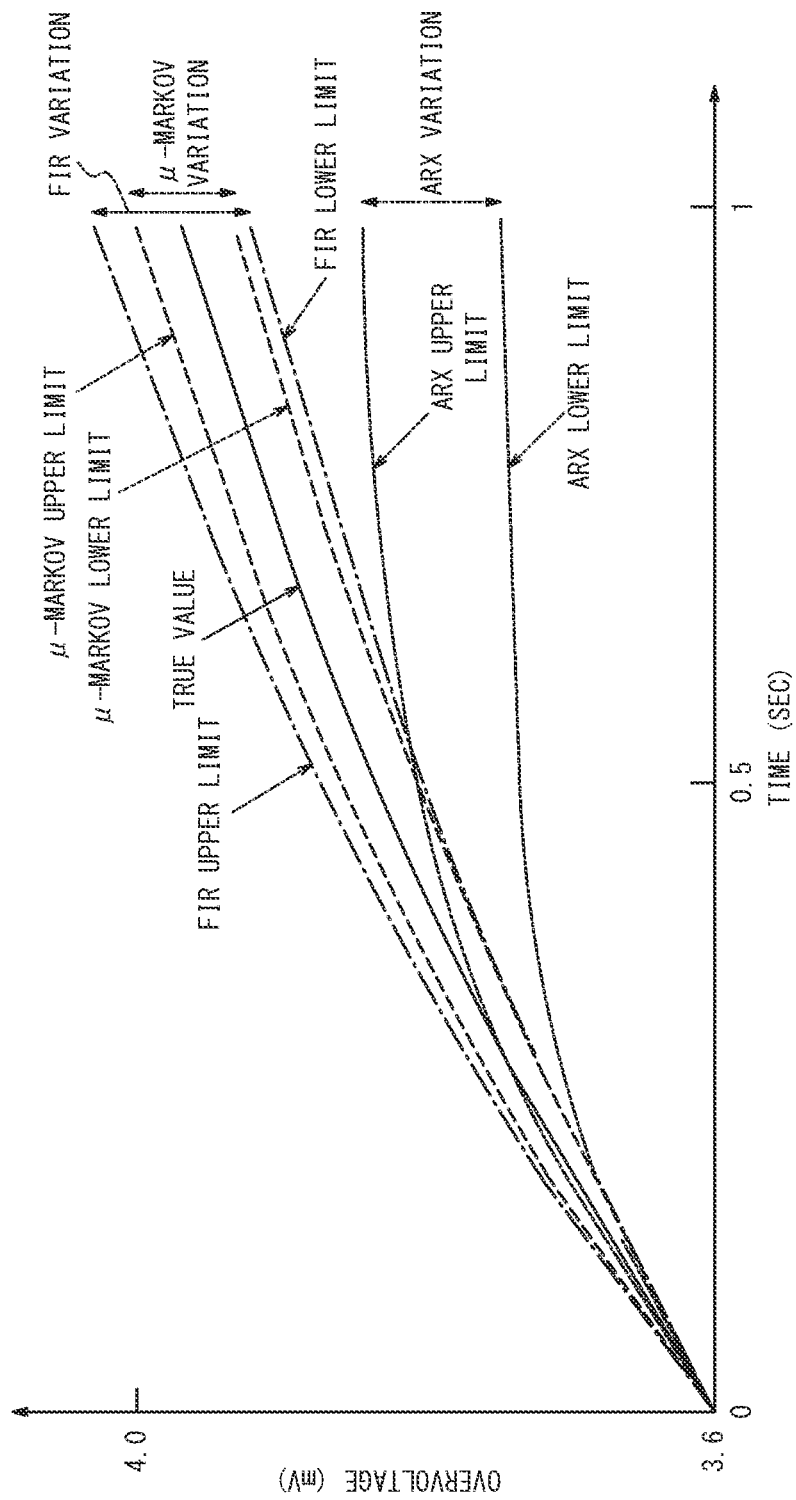
FIG. 8 is a graph illustrating an example of a result of estimating overvoltage for 1 second in the case where μ denoting the number of terms of a FIR model included in the μ-Markov model is 10.

In the case of, in the foregoing Case 2, adding Gaussian white noise of a mean value of 0 and a variance of 5.0×10⁻⁸ as observation noise (Case 3), the step response of the overvoltage was calculated as illustrated in the graph in FIG. 8. The horizontal axis of the graph in FIG. 8 represents time in seconds. The vertical axis of the graph in FIG. 8 represents overvoltage in mV. The graph in FIG. 8 illustrates the result of calculating the step response of the overvoltage for 1 second. As a result of the sampling cycle Ts being set to 0.1 seconds and μ that denotes the number of terms of the impulse response of the μ-Markov model being set to 10, the 1-second value resistance corresponding to the step response of the overvoltage after 1 second in the graph in FIG. 8 was calculated based only on the parameters of the impulse response.

Figure 9:
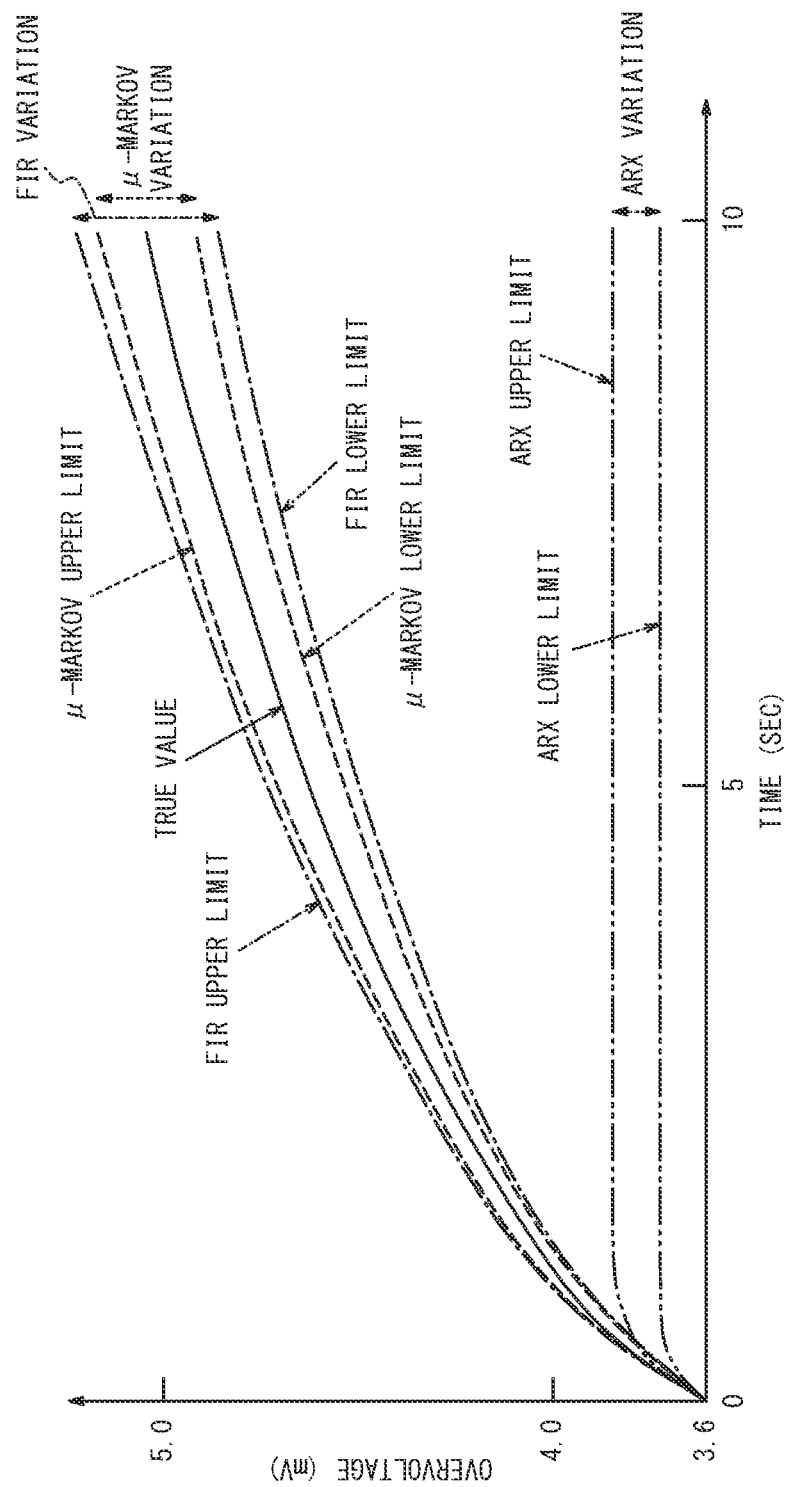
FIG. 9 is a graph illustrating an example of a result of estimating overvoltage for 10 seconds in the case where μ denoting the number of terms of the FIR model included in the μ-Markov model is 100.

In the case of, in the foregoing Case 3, setting μ that denotes the number of terms of the impulse response of the μ-Markov model to 100 (Case 4), the step response of the overvoltage was calculated as illustrated in the graph in FIG. 9. The horizontal axis of the graph in FIG. 9 represents time in seconds. The vertical axis of the graph in FIG. 9 represents overvoltage in mV. The graph in FIG. 9 illustrates the result of calculating the step response of the overvoltage for 10 seconds. As a result of the sampling cycle Ts being set to 0.1 seconds and μ that denotes the number of terms of the impulse response of the μ-Markov model being set to 100, the 10-second value resistance corresponding to the step response of the overvoltage after 10 seconds in the graph in FIG. 9 was calculated based only on the parameters of the impulse response.

In each of the graphs in FIGS. 8 and 9, the true value is designated by the solid line. In Case 3 and Case 4, the result of calculating the step response based on the μ-Markov model is within the range of the upper limit and the lower limit designated by the dashed lines. In Case 3 and Case 4, the result of calculating the step response based on the FIR model is within the range of the upper limit and the lower limit designated by the dashed-dotted lines. The result of calculating the step response based on the ARX model is within the range of the upper limit and the lower limit designated by the dashed-two dotted lines. As illustrated in FIGS. 8 and 9, the result of calculating the step response based on the μ-Markov model is closer to the true value than the result of calculating the step response based on each of the FIR model and ARX model. The variation in the result of calculating the step response based on the μ-Markov model is less than the variation in the result of calculating the step response based on each of the FIR model and the ARX model. Thus, the system identification device 1 can enhance the estimation accuracy of the step response by identifying the system based on the μ-Markov model. The estimation error of the step response increases with the passage of time from the input start time. The estimated value of the step response based on the μ-Markov model, however, deviates less from the true value even after, for example, 0.5 seconds.

Although the disclosed embodiments have been described by way of the drawings and examples, various changes and modifications may be easily made by those of ordinary skill in the art based on the present disclosure. Such changes and modifications are therefore included in the scope of the present disclosure. For example, the functions included in the components, steps, etc. may be rearranged without logical inconsistency, and a plurality of components, steps, etc. may be combined into one component, step, etc. and a component, step, etc. may be divided into a plurality of components, steps, etc.

REFERENCE SIGNS LIST 1 system identification device
2 current sensor
3 voltage sensor
4 battery
4a battery equivalent circuit
41a to 41d terminal
42 voltage source
44 internal impedance
10 observer
11 state variable estimation unit
12 OCV calculation unit
13 feedback unit
14 terminal voltage calculation unit
15 comparator
16 state variable correction value calculation unit
20 response estimation unit
25 operation unit
70 display unit
100 vehicle
110 controller

The invention claimed is:

1. A system identification method executed by a system identification device configured to estimate a response of a system that has a current flowing in a battery as input and an overvoltage of the battery as output, the system identification method comprising:

a first step of identifying the system by applying a model of the battery including a finite impulse response (FIR) model and an auto regressive exogenous (ARX) model to the system, based on time series data of each of the current flowing in the battery and the overvoltage of the battery in a predetermined period;
a second step of estimating, based on the model of the battery applied to identify the system in the first step, the overvoltage of battery output from the system at an estimation target time in a case where no current is input to the system before an input start time and the current is input to the system from the input start time onwards, the estimation target time being after the input start time;
a third step of calculating a t-second value resistance based on the overvoltage at the estimation target time and a predetermined current to the battery at the estimation target time; and
a fourth step of controlling an engine to perform an idling stop when the t-second value resistance is less than a determination reference value,
wherein a number of sets of data applied to the FIR model in the time series data is greater than or equal to a number obtained by adding 1 to a number obtained by dividing a period from the input start time to the estimation target time by a sampling cycle.

2. The system identification method according to claim 1, wherein the period from the input start time to the estimation target time is a cranking time when a vehicle that includes the system identification device restarts an engine after causing the engine to perform an idling stop.

3. The system identification method according to claim 2, wherein a sum of coefficients of terms, included in the period from the input start time to the estimation target time, of the FIR model is calculated as an internal resistance of the battery at the estimation target time, the FIR model being applied to identify the system in the first step.

4. The system identification method according to claim 3, wherein in the second step, the overvoltage of the battery at the estimation target time in a case where the current of a constant value is input to the system is estimated.

5. The system identification method according to claim 2, wherein in the second step, the overvoltage of the battery at the estimation target time in a case where the current of a constant value is input to the system is estimated.

6. The system identification method according to claim 1, wherein the period from the input start time to the estimation target time is a time during which an electric motor drives a vehicle when the vehicle is running, wherein the vehicle includes an engine, the electric motor and the system identification device.

7. The system identification method according to claim 6, wherein a sum of coefficients of terms, included in the period from the input start time to the estimation target time, of the FIR model is calculated as an internal resistance of the battery at the estimation target time, the FIR model being applied to identify the system in the first step.

8. The system identification method according to claim 7, wherein in the second step, the overvoltage of the battery at the estimation target time in a case where the current of a constant value is input to the system is estimated.

9. The system identification method according to claim 6, wherein in the second step, the overvoltage of the battery at the estimation target time in a case where the current of a constant value is input to the system is estimated.

10. The system identification method according to claim 1, wherein a sum of coefficients of terms, included in the period from the input start time to the estimation target time, of the FIR model is calculated as an internal resistance of the battery at the estimation target time, the FIR model being applied to identify the system in the first step.

11. The system identification method according to claim 10, wherein in the second step, the overvoltage of the battery at the estimation target time in a case where the current of a constant value is input to the system is estimated.

12. The system identification method according to claim 1, wherein in the second step, the overvoltage of the battery at the estimation target time in a case where the current of a constant value is input to the system is estimated.

13. The system identification method according to claim 1, wherein the number of sets of data applied to terms of the FIR model in the time series data is equal to the number obtained by adding 1 to the number obtained by dividing the period from the input start time to the estimation target time by the sampling cycle.

14. The system identification method according to claim 1, wherein in the first step, parameters of the FIR model are identified based on the FIR model and the ARX model.

15. The system identification method according to claim 1, wherein in the second step, an internal resistance of the battery at the estimation target time is calculated based on the overvoltage of the battery at the estimation target time and the current input to the battery at the estimation target time.

16. A system identification device comprising:
a response estimation unit configured to estimate a response of a system that has a current flowing in a battery as input and an overvoltage of the battery as output, wherein the response estimation unit is configured to:
identify the system by applying a model of the battery including a finite impulse response (FIR) model and an auto regressive exogenous (ARX) model to the system, based on time series data of each of the current flowing in the battery and the overvoltage of the battery in a predetermined period;
estimate, based on parameters of the model of the battery applied to identify the system, the overvoltage of the battery output from the system at an estimation target time in a case where no current is input to the system before an input start time and the current is input to the system from the input start time onwards, the estimation target time being after the input start time;
calculate a t-second value resistance based on the overvoltage at the estimation target time and a predetermined current to the battery at the estimation target time; and
control an engine to perform an idling stop when the t-second value resistance is less than a determination reference value,
wherein a number of sets of data applied to the FIR model in the time series data is greater than or equal to a number obtained by adding 1 to a number obtained by dividing a period from the input start time to the estimation target time by a sampling cycle.

* * * * *